(12) United States Patent
Zhang et al.

(10) Patent No.: US 8,987,055 B2
(45) Date of Patent: Mar. 24, 2015

(54) METHOD FOR PACKAGING LOW-K CHIP

(75) Inventors: Li Zhang, Jiangsu (CN); Zhiming Lai, Jiangsu (CN); Dong Chen, Jiangsu (CN); Jinhui Chen, Jiangsu (CN)

(73) Assignee: Jiangyin Changdian Advanced Packaging Co., Ltd, Jiangyin (CN)

( * ) Notice: Subject to any disclaimer, the term of this patent is extended or adjusted under 35 U.S.C. 154(b) by 0 days.

(21) Appl. No.: 14/233,461

(22) PCT Filed: Oct. 21, 2011

(86) PCT No.: PCT/CN2011/081112
§ 371 (c)(1),
(2), (4) Date: Feb. 25, 2014

(87) PCT Pub. No.: WO2013/010352
PCT Pub. Date: Jan. 24, 2013

(65) Prior Publication Data
US 2014/0162404 A1 Jun. 12, 2014

(30) Foreign Application Priority Data
Jul. 18, 2011 (CN) .......................... 2011 1 0200212

(51) Int. Cl.
*H01L 21/00* (2006.01)
*H01L 23/495* (2006.01)
(Continued)

(52) U.S. Cl.
CPC ...... *H01L 23/49582* (2013.01); *H01L 23/3107* (2013.01); *H01L 24/03* (2013.01);
(Continued)

(58) Field of Classification Search
USPC .................. 257/778, 784; 438/108, 118, 119
See application file for complete search history.

(56) References Cited

U.S. PATENT DOCUMENTS 6,271,469 B1   8/2001   Ma et al.
8,049,330 B2 * 11/2011  Tain et al. ................. 257/720
(Continued)

FOREIGN PATENT DOCUMENTS

CN      101604674      12/2009
CN      102122624       7/2011
(Continued)

OTHER PUBLICATIONS

International Search Report for international application No. PCT/CN2011/081112, dated Mar. 29, 2012 (6 pages).

*Primary Examiner* — Errol Fernandes
(74) *Attorney, Agent, or Firm* — Hamre, Schumann, Mueller & Larson, P.C.

(57) ABSTRACT

Provided is a method for packaging a low-k chip, comprising: attaching onto a carrier wafer a layer of temporary strippable film; arranging inversely a chip (2-1) onto the carrier wafer via the temporary strippable film; attaching thin film layer I (2-4) onto the carrier wafer for packaging; bonding a support wafer (2-5) onto the thin film layer I (2-4) and solidifying; forming a reconstructed wafer consisting of the chip (2-1), thin film layer I (2-4), and the support wafer; detaching the reconstructed wafer from the carrier wafer; completing a rewired metal wiring (2-6) on thin film layer I (2-4); forming a metal column (2-7) at an end of the rewired metal wiring (2-6); attaching thin film layer II (2-8) onto a surface of the metal column (2-7), packaging, and solidifying; coating a metal layer (2-9) on the top of the metal column (2-7), forming BGA solder balls (2-10) on the metal layer (2-9) by means of printing or ball planting; and finally slicing into individual BGA packages the reconstructed wafer having formed the BGA solder balls (2-10).

8 Claims, 2 Drawing Sheets

(51) Int. Cl.
*H01L 23/31* (2006.01)
*H01L 23/00* (2006.01)

(52) U.S. Cl.
CPC .............. *H01L 24/05* (2013.01); *H01L 24/95* (2013.01); *H01L 2224/05569* (2013.01); *H01L 2224/03334* (2013.01); *H01L 2224/02379* (2013.01); *H01L 2224/0382* (2013.01); *H01L 24/11* (2013.01); *H01L 24/13* (2013.01); *H01L 2224/0391* (2013.01); *H01L 2224/05572* (2013.01); *H01L 2224/04105* (2013.01); *H01L 2224/05541* (2013.01); *H01L 2224/12105* (2013.01); *H01L 2224/131* (2013.01)
USPC ........... 438/108; 257/778; 257/784; 438/118; 438/119

(56) References Cited

U.S. PATENT DOCUMENTS

| | | |
|---|---|---|
| 2005/0202590 A1 | 9/2005 | Huang et al. |
| 2007/0196979 A1* | 8/2007 | Tan et al. ...................... 438/253 |
| 2007/0273018 A1* | 11/2007 | Onozuka et al. .............. 257/690 |
| 2008/0122119 A1* | 5/2008 | Kian et al. .................... 257/783 |
| 2009/0311849 A1* | 12/2009 | Andry et al. .................. 438/464 |

FOREIGN PATENT DOCUMENTS

| | | |
|---|---|---|
| KR | 20080102641 | 11/2008 |
| KR | 20090032225 | 4/2009 |
| TW | 200531191 | 9/2005 |

* cited by examiner

METHOD FOR PACKAGING LOW-K CHIP

FIELD OF THE INVENTION

The present invention relates to a method for packaging low-K chip, and belongs to the technical domain of chip packaging.

BACKGROUND OF THE INVENTION

In the semiconductor manufacturing industry, the Moore's Law was always the power that pushed the industry to develop continuously, and Intel made great contributions in that aspect. The development of line width nodes of chips mainly include several stages: 0.18 μm stage—the initial stage of semiconductor process technology, in which MOS tubes became popularized and chips were manufactured in relatively large sizes; 0.13 μm stage—in that stage, people were fairly confident in semiconductor process technology and hoped to reduce chip area and cost by decreasing the feature size; those two stages were usually referred to as micrometer process technology stages. With the developed of nanometer technology, people's vision was no longer limited to micrometer technology but turned to nano-scale semiconductor process technology; 90 nm process technology emerged first; however, as the quantity of tube cores on unit area increased exponentially following the Moore's Law, 65 nm, 45 nm, 32 nm, and current 22 nm process technology emerged successively; the sharp reduction of feature size led to a pursuit for low dielectric loss constant (usually referred to as Low-k) of dielectric materials, for the purpose of reducing parasitic resistance, capacitance, and inductance of circuit structures while ensuring favorable insulating performance of circuits. Porous materials are usually selected for low-k materials; as a result, the materials are relatively brittle and may be fractured under external stress, causing line failures.

Owing to the brittleness of low-k materials, the chip packaging process has to be improved appropriately to adapt to the requirement for product application. Up to now, the packaging of low-k products still employs conventional flip-chip bonding or wire bonding, which results in severe loss of packaging yield. The result of failure analysis indicates that the failure is mainly resulted from fracture of the dielectric layer under bonding electrodes (wire bonding and flip-chip bonding). At present, the solution is to replace wire bonding packaging with flip-chip bonding packaging, and apply non-flow underfill on the substrate before flip-chip bonding. The packaging structure and process are shown in FIG. 1 and FIG. 2. The underfill has features of ordinary underfill and features of reflow flux; therefore, the solder balls and the bonding pad on the substrate can wet each other. A benefit of that method is: injuries to the dielectric layer in the chip under the stress of soldered balls during reflow in the conventional flip-chip packaging process can be alleviated, which is to say, the stress is redistributed via the non-flow underfill, and thereby the dielectric layer in the chip will not be injured owing to stress concentration. However, the biggest disadvantage of that method is that the wetting effect of flux is not enough to ensure every soldered ball can be bonded well to the bonding pad owing to the existence of the underfill; in addition, cavities may occur in the underfill during the curing process owing to the existence of flux and the application of reflow; moreover, the packaging process is complex and requires high cost.

In summary, there are mainly two drawbacks in the low-k chip packaging process at present:

1. With wire bonding and conventional flip-chip technology, stress concentration may occur at the chip electrodes under stress during the technological process, resulting in fracture of the low-k dielectric layer and chip failure;
2. With non-flow backfill in the flip-chip packaging process, poor bonding may exist and cavities may occur in the backfill after curing, causing degraded product reliability.

DISCLOSURE OF THE INVENTION

Technical Problem

To overcome the above-mentioned drawbacks, the present invention provides a method for packaging low-k chip and a low-k chip packaging structure, which can prevent low-k chip failures resulted from stress concentration in the chip packaging process and provide a low-cost packaging solution for low-k chips.

Technical Solution

The objects of the present invention are attained as follows: a method for packaging low-K chip, comprising the following steps:

step 1: taking a low-k wafer and cutting it into individual chips;

step 2: preparing a bearer wafer, forming aligning marks by photo-lithography on the bearer wafer, and completing pattern layout on the bearer wafer;

step 3: attaching a temporary strippable film to the bearer wafer, and mounting the chips obtained in step 1 one by one to the bearer wafer attached with the temporary strippable film, to accomplish flip-chip mounting;

step 4: attaching a film layer I to the bearer wafer for encapsulation after flip-chip mounting of the chips, bonding a supporting wafer to the film layer I in the encapsulation process, and then curing the film layer I, to form a restructured wafer composed of the chips, film layer I, and supporting wafer;

step 5: stripping the restructured wafer from the bearer wafer, and cleaning the surface of the chips on the restructured wafer, to expose the chip electrodes;

step 6: forming single-layer or multi-layer metal redistribution wiring on the surface of the film layer I and the chips by photo-lithography, sputtering, or electroplating, so as to lead the chip electrodes to the peripheral area of the chips via metal redistribution wires;

step 7: forming metal posts at the terminals of metal redistribution wires by photo-lithography or electroplating;

step 8: attaching a film layer II to the surface of the restructured wafer having the metal posts for encapsulation, curing the package, and then removing the film material on the top of the metal posts by laser ablation, to form complete or partial openings on the metal posts and expose the top of the metal posts out of the film layer II;

step 9: coating a metal layer on the top of the metal posts exposed out of the film layer II;

step 10: forming BGA bumps on the metal layer by printing or bumping, and finally cutting the restructured wafer with BGA bumps into individual BGA packages.

The metal posts are made of electrical-conductive metals such as copper or nickel, etc., and are in height within range of 50 μm-100 μm.

The metal layer adopts multilayer metal, has a Ni/Au or Ni/Pd/Au structure, and is in thickness not greater than 5 μm.

The film layer I and film layer II are made of a non-photosensitive material, respectively.

The supporting wafer is a silicon wafer or metal wafer.

The bearer wafer is a silicon substrate or glass substrate.

Beneficial Effects

Compared to the prior art, the present invention has the following advantages:

1. Since the chips are mounted onto the bearer wafer by direct flip-chip mounting, there is no reflow, and stress concentration can be avoided; therefore, chip failures resulted from stress concentration in the flip-chip process of BGA packaging for low-k chips in the prior art can be prevented;
2. The chip electrodes are extended to the non-chip area by wire redistribution through a wafer-level process; therefore, the stress generated in the attachment process of BGA structure is transferred, and the chip area is no longer in stressed state;
3. Metal post technique and structure are utilized to implement high power current carrying and uniform current distribution; in addition, the height of the copper posts is utilized to buffer the stress from BGA bumps, so that the stress will not be transferred to the redistribution layer;
4. With wafer-level packaging technique and metal post technique, the packaging cost can be reduced while the low-k chips are packed with high reliability;
5. The existing encapsulation technique in the prior art is replaced with a film attachment technique; therefore, the requirement for equipment used in the packaging process is decreased;
6. Bumping technique, flip-chip technique, and substrate technique are integrated to implement a BGA packaged wafer manufacturing process.

Figure 1:
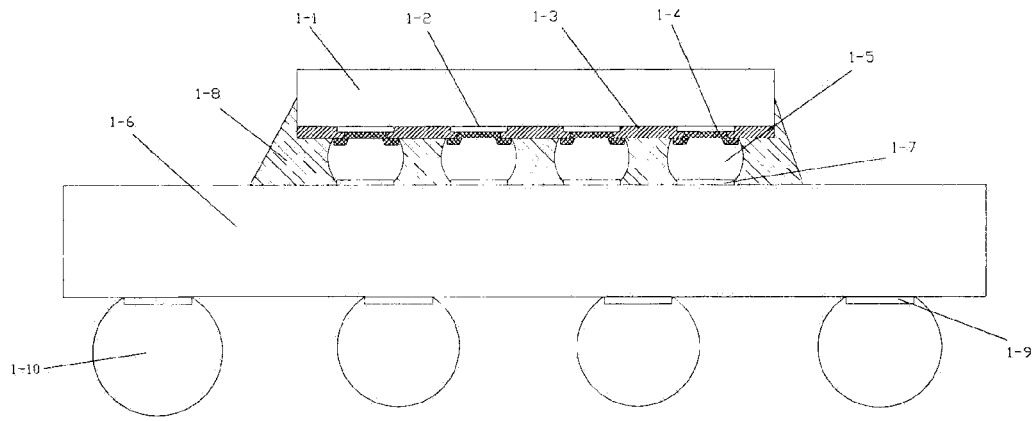
FIG. 1 is a schematic diagram of the low-k chip packaging structure in the prior art.
Figure 2:
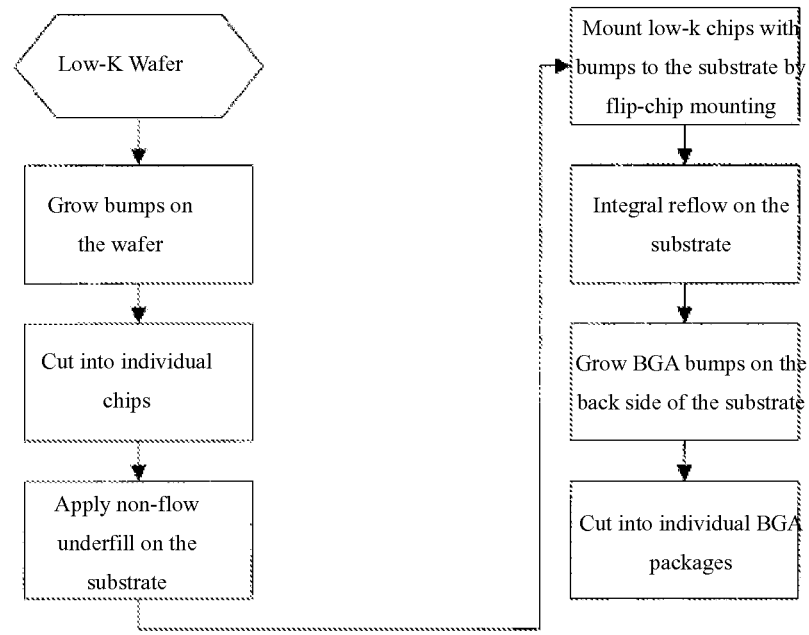
FIG. 2 is a flow diagram of packaging process of the low-k chip packaging structure in the prior art.

AMONG THE FIGURES 1-1: chip body
1-2: chip electrode
1-3 surface passivation layer
1-4: metal layer under bumps
1-5: solder bump
1-6: substrate
1-7: bonding pad on substrate I
1-8: underfill
1-9: bonding pad on substrate II
1-10: BGA bump
2-1: chip body
2-2: chip electrode
2-3: chip surface passivation layer
2-4: film layer I
2-5: supporting wafer
2-6: metal redistribution wire
2-7: metal post
2-8: film layer II
2-9: metal layer
2-10: solder bump

DETAILED DESCRIPTION OF THE EMBODIMENTS

Figure 3:
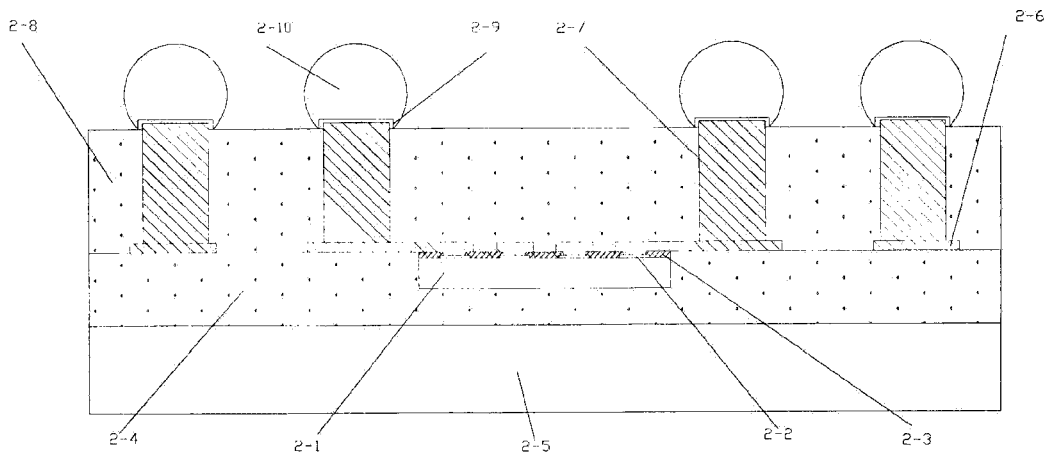
FIG. 3 is a schematic diagram of the low-k chip packaging structure disclosed in the present invention.
Figure 4:
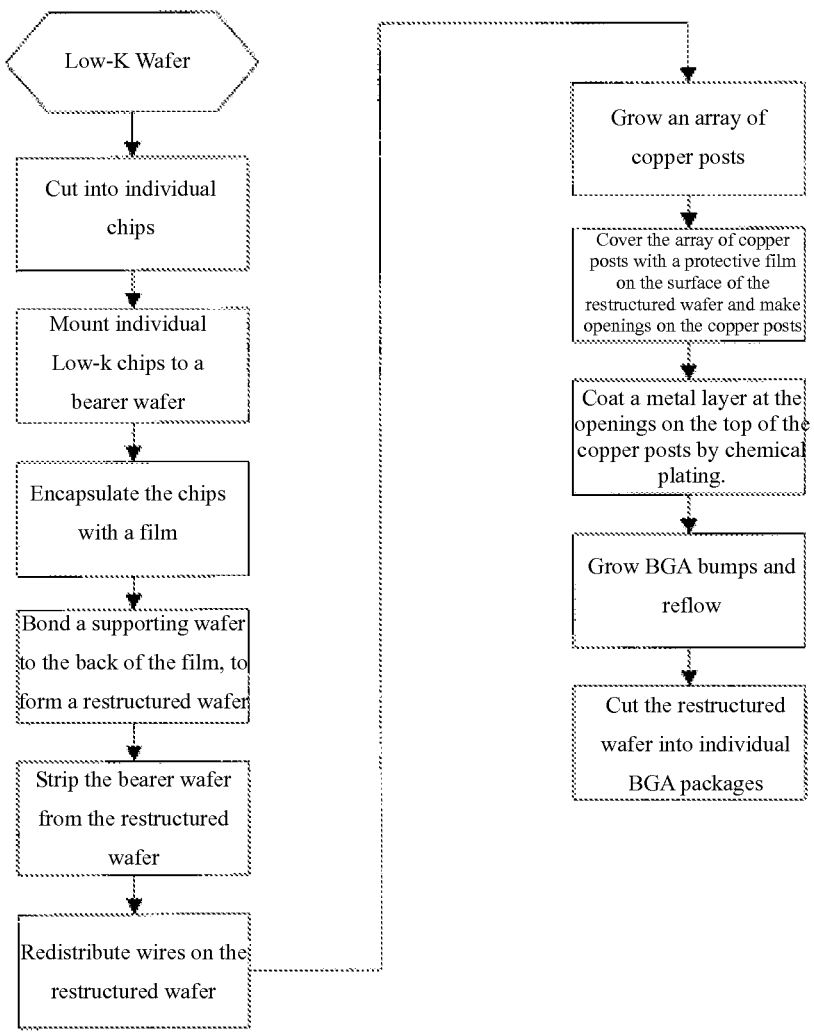
FIG. 4 is a flow diagram of packaging process of the low-k chip packaging structure disclosed in the present invention.

As shown in FIGS. 3~4, the present invention provides a low-k chip packaging structure, comprising chip body 2-1, chip electrodes 2-2, and chip surface passivation layer 2-3, wherein, the chip body 2-1 is wrapped with a film layer I 2-4, the back of the film layer I 2-4 is bonded with a supporting wafer 2-5, the chip electrodes 2-2 are led to the film layer I 2-4 in the peripheral area around the chip via the metal redistribution wires 2-6, metal posts 2-7 are arranged at the terminals of the metal redistribution wires 2-6, and the metal posts 2-7 are wrapped with a film layer II 2-8, with the top of the metal posts 2-7 exposed out of the film layer II 2-8; a metal layer 2-9 is arranged on the exposed top of the metal posts 2-7, and the metal layer 2-9 has bumps 2-10.

The implementation procedures of the low-k chip packaging structure provided in the present invention are as follows:

Step 1: taking a low-k wafer and cutting it into individual chips.

Step 2: preparing a bearer wafer, forming aligning marks by photo-lithography on the bearer wafer, and completing pattern layout on the bearer wafer;

The bearer wafer can be a silicon substrate or glass substrate, aligning marks are formed to facilitate the follow-up flip-chip mounting process and keep the chips at ideal positions.

Step 3: attaching a temporary strippable film to the bearer wafer, and mounting the chips obtained in step 1 one by one to the bearer wafer attached with the temporary strippable film.

The temporary strippable film is adhesive on both sides, and can bond well with the bearer wafer and the subsequently flip-chip mounted chips. The strippable film is thermally strippable or UV strippable. If the strippable film is UV strippable, a bearer wafer with glass substrate or quartz substrate has to be used since UV irradiation is required for UV stripping. Accordingly, the substrate must be transparent for UV transmission.

Flip-chip mounting is selected for two purposes: one is to ensure chips with different thickness can be mounted with the face side in the same plane in the subsequent process; the other is to prevent glue coverage on the face side of the chips on the restructured wafer, so as to facilitate subsequent processing.

step 4: attaching a film layer I 2-4 to the bearer wafer for encapsulation after flip-chip mounting of the chips, bonding a supporting wafer 2-5 to the film layer I 2-4 in the encapsulation process, and then curing the film layer I 2-4, to form a restructured wafer composed of the chips, film layer I 2-4, and supporting wafer 2-5;

The supporting wafer 2-5 is a silicon wafer or metal wafer, and the wafer surface is kept smooth in the encapsulation process because the film layer I 2-4 has good fluidity under heating.

Step 5: stripping the restructured wafer from the bearer wafer by UV irradiation or thermal stripping, and cleaning the surface of the chips on the restructured wafer, to expose the chip electrodes 2-2.

Step 6: forming single-layer or multi-layer metal redistribution wires 2-6 on the surface of the film layer I 2-4 and the chips by wafer-level photo-lithography, sputtering, or electroplating, so as to lead the chip electrodes 2-2 to the peripheral area of the chips (the area without chip) via metal redistribution wires 2-6.

Step 7: forming metal posts 2-7 at the terminals of metal redistribution wires 2-6 by photo-lithography or electroplating.

The metal posts 2-7 are made of an electrical-conductive metal material such as copper or nickel, etc.; the height of the metal posts 2-7 can be adjusted according to the requirements of structure, and shall not be smaller than 50 μm; usually, the height of the metal posts 2-7 is within the range of 50 μm-100 μm. Here, the metal posts 2-7 have two functions: one function is to reduce current crowding effect, i.e., the electric current can be distributed uniformly, and thereby the phenomenon of electric migration can be reduced; the other function is to utilize the height of the metal posts 2-7 to buffer the stress from the bumps 2-10 and thereby protect the low-k chips.

Step 8: attaching a film layer II 2-8 to the surface of the restructured wafer with the metal posts 2-7 for encapsulation, curing the package, and then removing the film material on the top of the metal posts by laser ablation, to form complete or partial openings on the metal posts 2-7 and expose the top of the metal posts 2-7 out of the film layer II 2-8.

The film layer I 2-4 and film layer II 2-8 are made of non-photo-sensitive insulating resin materials.

Step 9: coating a metal layer 2-9 on the top of the metal posts 2-7 exposed out of the film layer II 2-8.

The metal layer 2-9 adopts single layer metal or multilayer metal, usually has a Ni/Au or Ni/Pd/Au structure, and the thickness of the metal layer 2-9 should not be greater than 5 μm; the purpose of the metal layer 2-9 is to prevent inter-diffusion between stannum and copper in the soldering flux and improve product reliability.

Step 10: forming BGA bumps 2-10 on the metal layer 2-9 by printing or bumping, and finally cutting the restructured wafer with BGA bumps into individual BGA packages.

The invention claimed is:

1. A method for packaging low-k chip, comprising the following steps:
    step 1: taking a low-k wafer and cutting it into individual chips;
    step 2: preparing a bearer wafer, forming aligning marks by photo-lithography on the bearer wafer, and completing pattern layout on the bearer wafer;
    step 3: attaching a temporary strippable film to the bearer wafer, and mounting the chips obtained in step 1 one by one to the bearer wafer attached with the temporary strippable film, to accomplish flip-chip mounting;
    step 4: attaching a film layer I(2-4) to the bearer wafer for packaging after flip-chip mounting of the chips, bonding a supporting wafer (2-5) to the film layer I(2-4) in the packaging process, and then curing the film layer I(2-4), to form a restructured wafer composed of the chips, film layer I(2-4), and supporting wafer (2-5);
    step 5: stripping the restructured wafer from the bearer wafer, and cleaning the surface of the chips on the restructured wafer, to expose the chip electrodes (2-2);
    step 6: forming single-layer or multi-layer metal redistribution wires (2-6) on the surface of the film layer I (2-4) and the chips by photo-lithography, sputtering, or electroplating, so as to lead the chip electrodes (2-2) to the peripheral area of the chips via the metal redistribution wires (2-6);
    step 7: forming metal posts (2-7) at the terminals of metal redistribution wires (2-6) by photo-lithography or electroplating;
    step 8: attaching a film layer II (2-2) to the surface of the restructured wafer with the metal posts (2-7) for encapsulation, curing the package, and then removing the film material on the top of the metal posts by laser ablation, to form complete or partial openings on the metal posts (2-7) and expose the top of the metal posts (2-7) out of the film layer II (2-8);
    step 9: coating a metal layer (2-9) on the surface of the metal posts (2-7) exposed out of the film layer II (2-8);
    step 10: forming BGA bumps (2-10) on the metal layer (2-9) by printing or bumping, and finally cutting the restructured wafer with BGA bumps into individual BGA packages.

2. The method for packaging low-k chip according to claim 1, wherein, the chip body (2-1) has no bump when it is flip-chip mounted to the bearer wafer.

3. The method for packaging low-k chip according to claim 1, wherein, the chip electrodes (2-2) are led to the peripheral area of the package through a wafer-level wire redistribution process.

4. The method for packaging low-k chip according to claim 1, wherein, the film layers (2-4) and (2-8) are bonded to the wafer by attachment.

5. The method for packaging low-k chip according to claim 1, wherein, openings are made on the film layers (2-4) and (2-8) by laser ablation.

6. The method for packaging low-k chip according to claim 1, wherein, the metal posts (2-7) are formed by photolithography, sputtering, or electroplating.

7. The method for packaging low-k chip according to claim 1, wherein, the metal layers (2-9) are formed by chemical plating.

8. The method for packaging low-k chip according to claim 1, wherein, the bearer wafer is stripped from the glass substrate of the restructured wafer by thermal stripping or UV stripping.

* * * * *